United States Patent [19]

Vance

[11] 4,254,503

[45] Mar. 3, 1981

[54] RADIO RECEIVER FOR TONE MODULATED SIGNALS

[75] Inventor: Ian A. W. Vance, Newport, England

[73] Assignee: International Standard Electric Corporation, New York, N.Y.

[21] Appl. No.: 86,542

[22] Filed: Oct. 19, 1979

[30] Foreign Application Priority Data

Oct. 24, 1978 [GB] United Kingdom ............... 41679/78

[51] Int. Cl.³ .............................................. H04B 1/16
[52] U.S. Cl. ....................................... 375/91; 375/88; 375/89
[58] Field of Search ............................... 375/88, 91, 89

[56] References Cited

FOREIGN PATENT DOCUMENTS 1517121 7/1978 United Kingdom ...................... 375/91

Primary Examiner—Harold I. Pitts
Attorney, Agent, or Firm—James B. Raden; Marvin M. Chaban

[57] ABSTRACT

A radio receiver for frequency modulated (FM) tones. Received signals are split and one split portion of the signal is phase shifted relative to the other and mixed with a local oscillator. The signal as received clocks a flip-flop. The phase shifted signal is fed to the switching input of the flip-flop. The input signal having been modulated with an FM tone which oscillates about the frequency of the local oscillator, the output of the flip-flop is a digital waveform the frequency of which is the same as that of the modulating tone. This digital waveform is applied to a band pass filter accepting the fundamental frequency of the digital wave form from the flip-flop for passage to a detector.

6 Claims, 3 Drawing Figures

RADIO RECEIVER FOR TONE MODULATED SIGNALS

BACKGROUND OF THE INVENTION

This invention relates to a radio receiver for frequency modulated tones, such as is used in radio-paging systems and some navigation systems.

In such systems the input signals at the receiver consist of a sinewave tone (audio) frequency modulated onto a radio frequency carrier wave. Existing receivers for these signals generally use the superheterodyne principle which requires filtering to remove first order responses (so called image response). Homodyne (zero intermediate frequency) receivers are known which will demodulate frequency modulated signals in general but these require complex hardware to realise them. For the reduced requirement of detecting simply the presence or absence of a modulating tone the more simple receiver described herein may be employed.

SUMMARY OF THE INVENTION

According to the present invention there is provided a radio receiver for frequency modulated tones comprising first and second signal paths to which the received radio signals are applied, each signal path including a mixer circuit followed by a low pass filter and a limiting amplifier stage, a local oscillator running at the carrier frequency, the local oscillator output being applied to one mixer circuit direct, means for applying the oscillator output to the other mixer circuit with a 90° phase shift, a D-type clocked flip-flop to the D input of which is applied the output of one of the limiting amplifier stages whilst the output of the other limiting amplifier stage is applied to the clock input of the flip-flop, filter means to which the output of the flip-flop is applied and detector means to which the filter output is applied.

BRIEF DESCRIPTION OF THE DRAWINGS

An embodiment of the invention will now be described with reference to the accompanying drawings, in which:

FIG. 3 illustrates a modification of the arrangement of FIG. 1.

DESCRIPTION OF THE PREFERRED EMBODIMENT

Figure 1:
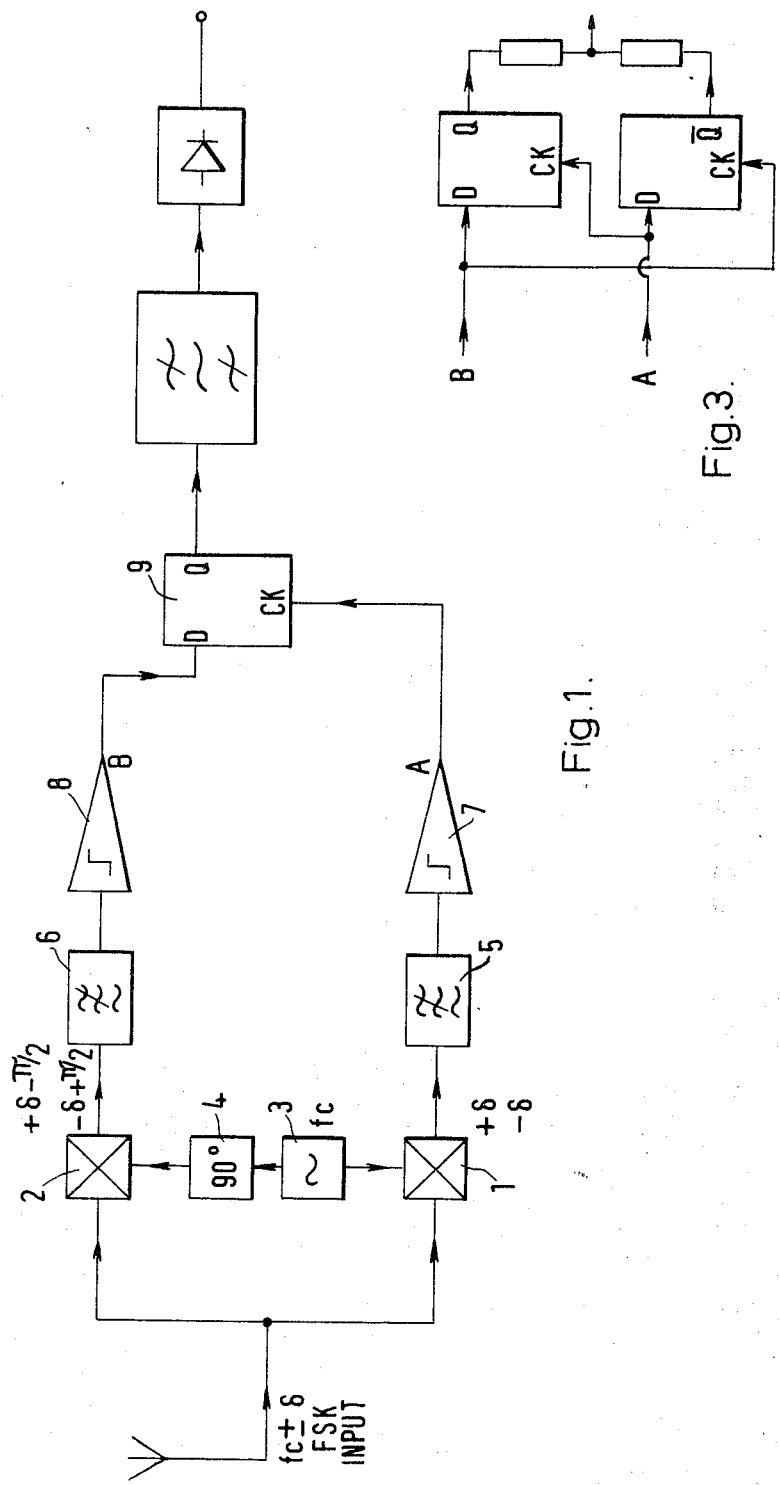
FIG. 1 illustrates schematically a radio receiver.

In the receiver of FIG. 1 the received frequency modulated radio signals $f_c \pm \delta$ are fed to two high gain mixer circuits 1 and 2. A local oscillator 3 running at the frequency $f_c$ is fed directly to mixer circuit 1 and via a phase shift network 4, which introduces a 90° phase shift, to mixer 2. The outputs of mixer circuits 1 and 2 are fed to a low-pass filters 5 and 6 respectively. The filtered signals are then fed to high gain limiting amplifier stages 7 and 8 respectively. The output of amplifier stage 7 is fed to the clock input of a D-type flip-flop 9 and the output of amplifier stage 8 is fed to the D input of the flip-flop 9.

Figure 2:
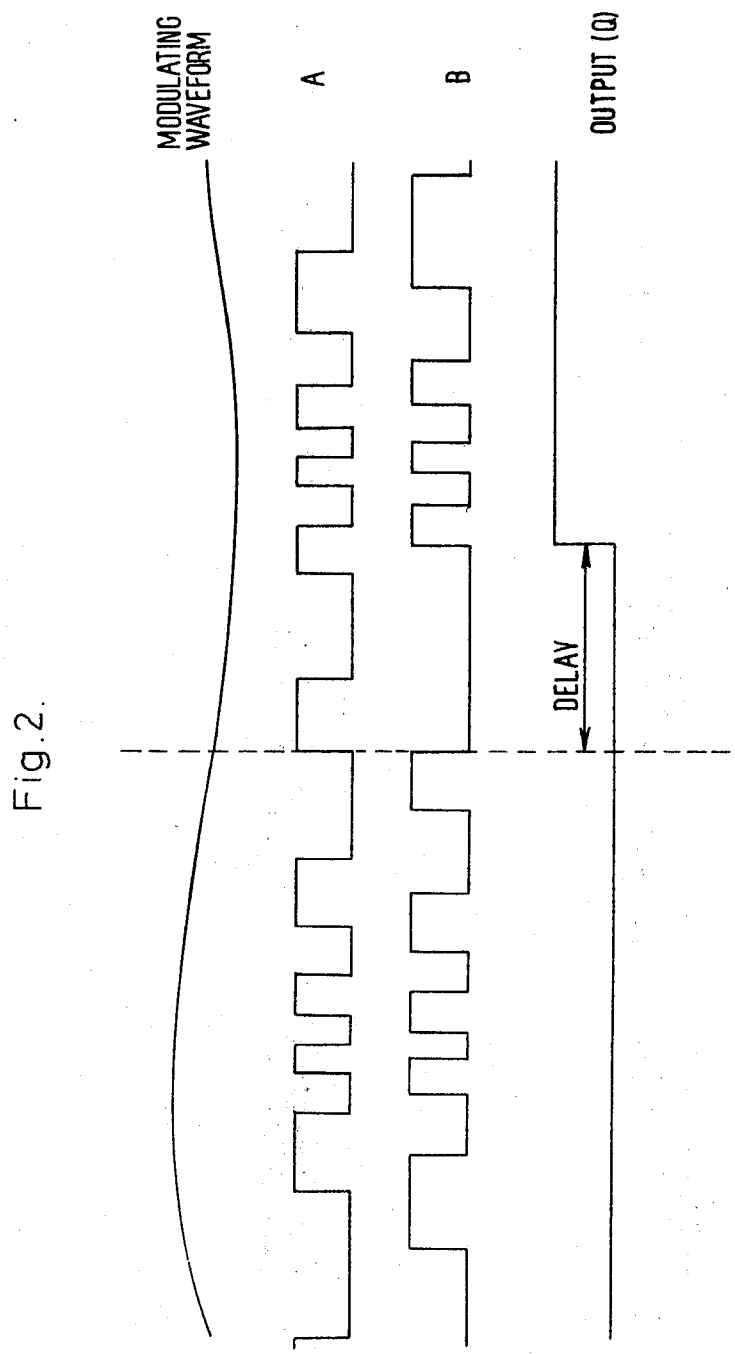
FIG. 2 illustrates waveforms in the receiver of FIG. 1.

The operation of the circuit is as follows: If the input signal is for example at a lower frequency than the local oscillator, then as indicated in FIG. 2 the output A of limiting amplifier 7 will lead the output B of amplifier 8 by 90°. Conversely when the input signal is higher in frequency than the local oscillator then output A will lag output B by 90°. These two possible conditions are detected by the D-type flip-flop which transfer to the "Q" output the state of the D input when a positive edge occurs on the clock. Inspection of FIG. 2 indicates that this results in a logical "one" output for inputs lower than the local oscillator frequency and a logical "zero" for higher frequency inputs.

In the present case the input signal is frequency modulated with a sinewave tone and thus continually oscillates between the low side and the high side of the local oscillator. The output of the receiver described will then be approximately a squarewave at the "Q" of the flip-flop 9 with a fundamental frequency which is the same as that of the modulating tone. As indicated in FIG. 2 there will be a delay when the frequency changes from high to low of the local oscillator due to the fact that no change of the flip-flop condition can occur until the next positive going clock edge. Since the phase of the transition point is arbitrary the delay is randomly distributed up to a maximum value which is determined by the ultimate difference frequency between the input signal and the local oscillator, that is the deviation of the frequency modulation of the input carrier. When the modulation frequency is less than half the deviation frequency (single side peak) then there will always be at least one positive edge of the clock in each modulation half cycle, and the system will operate. The band-pass filter 10 may be tuned such that it accepts the fundamental frequency of the digital waveform from the flip-flop. The detector 11 then gives an output indication if the level of the signal in the filter pass-band exceeds a predetermined level. Thus the presence or absence of a correctly modulated tone is detected.

As a modification to the simple arrangement shown in FIG. 1 a second D-type flip-flop may be introduced, as shown in FIG. 3. The clock input of flip-flop 9, from one path, is also fed to the D input of the flip-flop 12 and the D input to flip-flop 9, from the other path, is fed to the clock input of flip-flop 12. The Q output of flip-flop 9 and the $\bar{Q}$ output of flip-flop 12 are then added algebraically via a pair of resistors 13, 14. The added signal forms the input to the band-pass filter 10. This arrangement forms a balanced feed for the band-pass filter.

The selective filter may be controlled by a logic circuit which switches it to detect a predetermined sequence of different tones. The selective filter can be in the form of a phase locked loop detector. Alternatively the filter/detector part of the receiver may be in the form of a digital correlator.

I claim:

1. A radio receiver for frequency modulated tones comprising a local oscillator running at the carrier frequency, first and second signal paths to which the received radio signal are applied, each path including means for mixing the local oscillator output with the received signals followed by a low pass filter and a limiting amplifier stage, means for introducing a 90° phase shift between the local oscillator output and the received radio signals in one of said paths only prior to the mixing of the oscillator output and the received signals, a flip-flop having a clock input and a signal input, means applying the output of one of the limiting amplifier stages to the signal input of the flip-flop and for applying the output of the other limiting amplifier stage to the clock input of the flip-flop, filter means to which the output of the flip-flop is applied and detector means to which the filter output is applied.

2. A receiver according to claim 1, including a second similar flip-flop connected such that the clock input of the first flip-flop is connected to the signal input of the second flip-flop and the signal input of the first flip-flop is connected to the clock input of the second flip-flop and in which there are means for algebraically adding the output of the first flip-flop with the absence of output of the second flip-flop, the sum of the algebraic addition being applied to the filter means.

3. A receiver according to claim 1, in which the filter means is a band pass filter, and further including means for switching the band pass filter to detect a predetermined sequence of different tones.

4. A receiver according to claim 1, wherein the filter means is a phase locked loop detector circuit.

5. A receiver according to claim 1, wherein the filter means and the detector means are in the form of a digital correlator.

6. A receiver according to claim 1, wherein the means for introducing a 90° phase shift is positioned between the local oscillator output and the mixing means.

* * * * *